(12) United States Patent
Ohshima et al.

(10) Patent No.: US 11,251,011 B2
(45) Date of Patent: Feb. 15, 2022

(54) ELECTRON MICROSCOPE

(71) Applicant: HITACHI HIGH-TECH CORPORATION, Tokyo (JP)

(72) Inventors: Takashi Ohshima, Tokyo (JP); Hiroyuki Minemura, Tokyo (JP); Yumiko Anzai, Tokyo (JP); Momoyo Enyama, Tokyo (JP); Yoichi Ose, Tokyo (JP); Toshihide Agemura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 158 days.

(21) Appl. No.: 16/089,281

(22) PCT Filed: Mar. 29, 2016

(86) PCT No.: PCT/JP2016/060089
§ 371 (c)(1),
(2) Date: Sep. 27, 2018

(87) PCT Pub. No.: WO2017/168554
PCT Pub. Date: Oct. 5, 2017

(65) Prior Publication Data
US 2020/0303152 A1    Sep. 24, 2020

(51) Int. Cl.
*H01J 37/073*    (2006.01)
*H01J 37/22*    (2006.01)

(52) U.S. Cl.
CPC ............ *H01J 37/073* (2013.01); *H01J 37/22* (2013.01); *H01J 2237/06333* (2013.01); *H01J 2237/2482* (2013.01); *H01J 2237/2614* (2013.01)

(58) Field of Classification Search
USPC ......................................... 250/306, 307, 311
See application file for complete search history.

(56) References Cited

U.S. PATENT DOCUMENTS 5,684,360 A    11/1997  Baum et al.
6,005,247 A    12/1999  Baum
(Continued)

FOREIGN PATENT DOCUMENTS

JP    61-091844 A    5/1986
JP    H11-509360 A    8/1999
(Continued)

OTHER PUBLICATIONS

Office Action dated Sep. 2, 2019 in counterpart Chinese Application No. 201680084076.4.
(Continued)

*Primary Examiner* — Jason L McCormack
(74) *Attorney, Agent, or Firm* — Miles & Stockbridge, P.C.

(57) ABSTRACT

To provide an electron microscope capable of performing the switching-over between normal illumination and annular illumination, wide-area irradiation, an interference pattern as desired or normal illumination in an expeditious and readily manner or achieving a better S/N ratio, the electron microscope comprises a photocathode 101 with negative electron affinity in use; an excitation optical system to excite the photocathode; and an electron optics system to irradiate an electron beam 13 generated from the photocathode by excitation light 12 irradiated through the excitation optical system onto a sample, the excitation optical system including a light source device 107 for the excitation light; and an optical modulation means 108 which is disposed in an optical path of the excitation light to perform spatial phase modulation to the excitation light.

8 Claims, 6 Drawing Sheets

(56) References Cited

U.S. PATENT DOCUMENTS

| | | | |
|---|---|---|---|
| 6,828,574 B1 | 12/2004 | Allen | |
| 2002/0079448 A1 | 6/2002 | Tohru et al. | |
| 2006/0169928 A1* | 8/2006 | Sogard | H01J 37/242 250/492.24 |
| 2007/0228286 A1* | 10/2007 | Lewellen | H01J 1/34 250/423 P |
| 2008/0291952 A1* | 11/2008 | Yamamoto | H01S 5/0265 372/26 |
| 2010/0108882 A1 | 5/2010 | Zewail | |
| 2011/0089397 A1 | 4/2011 | Ujihara et al. | |
| 2013/0009058 A1* | 1/2013 | Tanaka | H01J 37/26 250/311 |
| 2013/0193342 A1* | 8/2013 | Berney | H01J 37/28 250/399 |
| 2017/0077352 A1 | 3/2017 | Kondo et al. | |

FOREIGN PATENT DOCUMENTS

| | | |
|---|---|---|
| JP | 2001-143648 A | 5/2001 |
| JP | 2001143648 A | 5/2001 |
| JP | 2001-176120 A | 6/2001 |
| JP | 2001-526446 A | 12/2001 |
| JP | 2002-124205 A | 4/2002 |
| JP | 2003-525514 A | 8/2003 |
| JP | 2009-266809 A | 11/2009 |
| JP | 2010-218868 A | 9/2010 |
| JP | 2017054954 A | 3/2017 |
| WO | 99/30348 A | 6/1999 |

OTHER PUBLICATIONS

International Search Report dated Jun. 14, 2016 for International Application No. PCT/JP2016/060089.
Kuwahara et al. "Coherence of a spin-polarized electron beam emitted from a semiconductor photocathode in a transmission electron microscope" Applied Physics Letters, 2014, vol. 105, p. 193101 (5 pages).
Izumitani, Tetsuro. "High Precision Moulding of Aspherical Glass Lenses. Journal of the Japan Society of Precision Engineering" pp. 12-15.
HS Park et al. "4D ultrafast electron microscopy: Imaging of atomic motions, acoustic resonances, and moire fringe dynamics" Ultramicroscopy, Aug. 2009, pp. 7-19, vol. 110.
A. M. Weiner "Femtosecond pulse shaping using spatial light modulators" Review of Scientific Instrument Jan. 2000, pp. 1929-1960, vol. 71, No. 5.
Search Report dated Apr. 10, 2019 in International Application No. PCT/JP2019/002803.
Office Action dated Jun. 28, 2021 in German Application No. 11 2016 006 486.1.

* cited by examiner

ELECTRON MICROSCOPE

TECHNICAL FIELD

The present invention relates to an electron microscope.

BACKGROUND ART

As with a high-resolution electron microscope, conventionally, such electron guns with high-brightness are used as their tip ends taking a smaller needle shape like cold cathode field emission electron sources and Schottky electron sources; and the size of their virtual sources ranging from several nm to several tens nm. As one of electronic optical modulation methods to enhance the resolution of such electron microscope, annular illumination disclosed in Patent Literature 1 below is exemplified. This annular illumination is such that an annular illumination diaphragm 20 e.g. as illustrated in FIG. 2 is disposed in the passage of the electron beam; the center portion of the electron beam is shielded with a center shielding unit 23; and the electron beam passed through the annular aperture portion 21 is focused on the sample surface with an objective lens in use, thereby, the beams being interfered with each other so as to enable observation with a greater depth of focus.

Further, as with the electron sources employing a photocathode in which light is made incident on a p-type GaAs filmy cathode to emit electrons with the utilization of negative electron affinity, such technique is disclosed in Patent Literature 2 as upon the electron beam being exposed, excitation light being irradiated onto the photocathode from a plurality of optical elements and irradiation light being scanned to vary the emission patterns of electrons in shape or a mask to shield the electron emission being disposed on the cathode to make the electron beam thinner.

CITATION LIST

Patent Literature

Patent Literature 1: Japanese Patent Unexamined Application Publication No. 2002-124205
Patent Literature 2: Japanese Republication No. 2001-526446 via PCT

SUMMARY OF INVENTION

Technical Problem

According to the conventional annular illumination, it requires supports 22 to fix the center shielding unit 23 in order to make the diaphragm exclusively disclosed in Patent Literature 1 inserted into the passage of the electron beam, so that scattered electrons arising from the electron beam colliding with the support 22 and the surrounding members intervene so as to possibly cause noise. Further, in the case where the observation employing an aperture 24 is switched over to that employing the annular aperture portion 21, it generally requires that the precise adjustment of each position be made, so that it is considered hard to carry out such switch-over in a readily manner. Moreover, with the electron beam emitted from the electron source, the current density at its center portion is highest, but such portion is shielded by the center shielding unit 23, so that the probe current reduces, as the result of which the S/N ratio of an image possibly deteriorates. In other words, as regards the utilization of the conventional annular illumination, the electron source whose shape and size is constant is put to use, so that in our opinion it entails the difficulty in adjustment with which annular beams are formed at the diaphragm downstream of the electron source.

On the other hand, the electron source size obtained through a plurality of optical paths and irradiation light scanning according to the disclosure of Patent Literature 2 tends to become large, so that upon making such size reduced so as to produce a smaller dot, it often happens that sufficient probe current is not gained. Moreover, although annular light sources optimally smaller in size can be formed by the mask being placed on the photocathode, it requires that the positional alignment between the focus of excitation light and the mask be made and the positional alignment between the resulting electron sources and the electron optics system be further made, so that it is apprehended that it takes a lot of time and labor on the part of the users to their disadvantage. Furthermore, similarly, in the case where the switch-over to the normal optical conditions which are not accompanied with annular light sources be needed, it requires that the displacement and alignment of the photocathode be must every time such switch-over happens, so that it is apprehended that it takes a lot of time and labor on the part of the users to their disadvantage. It is also disclosed that annular light is irradiated onto the photocathode, but the optical intensity distribution on the photocathode surface does not take annular distribution, in which only the single peak is obtained while the resulting electron beam is of the single peak.

The present invention is to provide an electron microscope allowing the switch-over between normal illumination and, for example, annular illumination or wide-area irradiation, desired interference patterns in a fast and readily manner or enabling a better S/N ratio to be achieved.

Solution to Problem

In order to achieve the above aims, as one embodiment of the present invention, an electron microscope is provided, the microscope being characterized in comprising a photocathode with negative electron affinity in use; an excitation optical system to excite the photocathode; and an electron optics system to irradiate an electron beam generated from the photocathode by excitation light irradiated through the excitation optical system onto a sample, wherein the excitation optical system includes a light source device for the excitation light; and an optical modulation means which is disposed in an optical path of the excitation light to perform spatial phase modulation to the excitation light.

Further, the electron microscope according to the present invention is characterized in comprising a light source for an excitation light; a photocathode to emit electrons by the excitation light from the light source for the excitation light; an optical modulation means which is disposed in an optical path between the light source for the excitation light and the photocathode to make the excitation light optically modulated; and an electron optics system to irradiate electrons emitted from the photocathode onto a sample as an electron beam.

Advantageous Effects of Invention

The present invention can provide an electron microscope, in which the switch-over among normal illumination and annular illumination or wide-area irradiation, desired interference patterns in a fast and readily manner or a better S/N ratio can be achieved.

DESCRIPTION OF EMBODIMENTS

Figure 1:
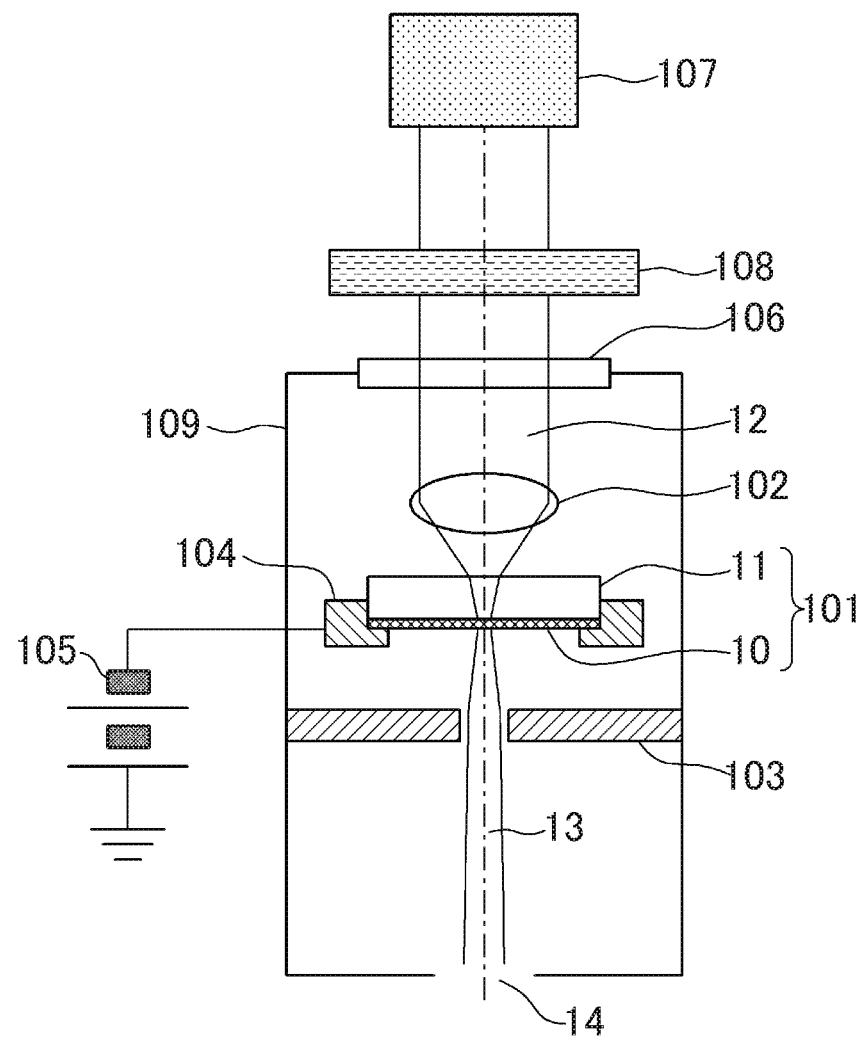
FIG. 1 is a schematic cross-sectional view illustrating one example of the photoexcited electron gun of the electron microscope according to the first embodiment of the present invention.

The concerned including the inventors with the present invention have discussed the method of switching over in an expeditious manner between the normal illumination and other irradiations by the electron beam. As the result of it, the concerned have reached the finding that the shape of the electron beam can be modified in an expeditious manner without modifying the electron optics system just by changing the shape of the excitation light by the optical modulation means. The present invention is based on such finding. Specifically speaking, in the case where the switch-over between annular illumination and normal illumination is carried out, use is made of the photocathode utilizing negative electron affinity as the electron source, in other words, the photocathode essentially consisting of a p-type semiconductor film and provided with a work function reduction means on its surface; this excitation light a condensing lens provided in vacuum; a parallel light source provided in the atmosphere for excitation; and an optical modulation means provided in the optical path of the excitation light. In the case where such optical modulation means corresponds to the transmissive spatial phase modulator, by disposing, for example, a transparent plate and providing phase shift areas axially symmetrical to each other on the transparent plate, the excitation light travelling via such phase shift areas becomes annular in shape or takes the annular shape whose center is darkened at the focal point of the condensing lens. As the result of it, the emitted electron beam becomes annular in shape so as to be focused on and irradiated onto a sample via the electron optics system.

According to the above arrangement, by disposing such phase shift areas in the optical path of the excitation light, the focal point on the photocathode film which is condensed by the condensing lens takes an annular pattern with its center darkened and its surrounding brightened, as the result of which the electron source of the electrons emitted from the photocathode film to the vacuum takes a doughnut shape because such electron source depends on light intensity. The emission angle of the electrons emitted from such photocathode is characterized in being narrower in expansion and upon such emission angle being reduced with the electron optics system downstream so as to be narrowed onto the sample, the electron beam in the vicinity of the center is selected with an angle limiting aperture, as the result of which only the electron beam substantially perpendicularly emitted from the cathode are selected, so that the electron beam irradiated onto the sample assumes annular illumination with its center portion removed, thereby, enabling observation with a larger depth of focus. As such annular illumination is realized just when the excitation light passes through the phase shift areas of the transmissive spatial phase modulator, by displacing the transmissive spatial phase modulator such that the light free from phase shift is allowed to pass, the focal point of the excitation light becomes one small spot, thereby, allowing the electron microscope to be used by switching over to normal observation in an expeditious and readily manner without the need of modifying the electron beam optic system. Further, at the time of the annular illumination as well, there is no case where the electron beam current reduces, so that the sample can be observed with a better S/N ratio intact.

Hereafter, the present invention is explained in the form of embodiments with reference to the accompanying drawings. It should be noted that the same reference signs denote the same features.

First Embodiment

FIG. 1 is a schematic cross-sectional view of an electron gun of the electron microscope according to the first embodiment of the present invention. In the present embodiment, mainly, explanation on the case where the switch-over between the annular illumination and the normal illumination is carried out is given. The photocathode 101 comprises a photocathode film 10 and a transparent substrate 11 and is arranged such that it generates electrons from the lower face of the photocathode film 10 upon the excitation light 12 being made incident from its upper face, in which the electrons are accelerated by the electric field between opposed extraction electrode 103 and introduced as an electron beam 13 to the electron optics system downstream from the lower opening 14 of the electron gun. This electron source makes use of the phenomenon known to the persons skilled in the art as negative electron affinity, wherein the photocathode film 10 is a p-type semiconductor and GaAs or GaP is representatively adopted for such semiconductor film. Such photocathode film is used with a work function reduction means or representatively Cs and oxygen absorbed to its surface. For this purpose, a preparation room (not illustrated in the drawing) is provided adjacent to the electron gun, wherein the surface condition of the photocathode 101 is adjusted with a vacuum valve and a cathode displacement means. The adjustment means for such surface condition includes a cleaning means to remove oxides and carbides attached on the semiconductor surface. Specifically speaking, a heater is adopted for such cleaning means. It is preferred that such heater be concurrently used with an atomic hydrogen generation means to enhance cleaning effect. Further, the work function of the photocathode film surface reduces with a Cs evaporation means and an oxygen introduction means, which leads to the vacuum level of its surface is lower than the bottom of the conduction band within the cathode film. As the result of it, the electrons excited from the valence band to the conduction band through the incidence of the excitation light with energy sufficient to make the interband transition for p-type semiconductor are already higher in potential energy than such vacuum level so that they are emitted into vacuum by the electric field created on the film surface. The wavelength of the excitation light for the GaAs filmy cathode shall be 850 nm or smaller, in which such wavelength is preferably in the order of 660 nm to 780 nm while that for the GaP filmy cathode is preferably 540 nm or smaller. When the electrons in the conduction band become widespread within the photocathode film, it leads to enlarging the size of the electron source, as the result of which brightness deteriorates so as to badly affect the performance of the microscope. Thus, it is preferred that the thickness of the photocathode film be by far smaller than 1 µm. Further, the sufficiently high concentration of the p-type impurities must be taken into account as well. Such photocathode film is adhered to the transparent substrate 11 which does not absorb the excitation light to support the film. In the case where such photocathode film is a GaAs filmy cathode, glass or such semiconductors wide in band gap as GaP are adopted for the transparent substrate 11. Such photocathode film may be directly adhered to the transparent substrate 11, but it may be adhered thereto with the intervention of an intermediate layer. Further, in the case where semiconductors are adopted for the transparent substrate 11, the photocathode film 10 may be formed through epitaxial growth, in which case a buffer layer acting as an intermediate layer may be grown.

The acceleration voltage to the electron source is applied from an external acceleration power source 105 to a cathode holder 104 in electrical contact with the photocathode film 10 and forms an accelerating electric field between the extraction electrodes. This electron gun is exhausted by a vacuum exhaust means not illustrated in the drawing, preferably, an ion pump and a non-evaporable getter pump not illustrated in the drawing.

The condensing lens 102 (see FIG. 1) to condense the excitation light 12 for the photocathode 101 is such a lens that its spherical aberration is corrected in such a manner that the focal point formed on the photocathode film 10 through the transparent substrate 11 becomes minimum. According to the present embodiment, the diameter of the parallel light ranges from 4.0 to 4.2 mm and its NA (Numerical Aperture) is 0.5. As the result, the excitation light (laser beam) having 660 nm in wavelength has the diameter in the order of 1 µm (half width) on the photocathode film 10 as illustrated in FIG. 5A with a broken line A. Now, the parallel excitation light is emitted from a parallel light source 107 located on the outside of a vacuum container 109 and is made incident on the interior of the vacuum container 109 as well through the transmissive spatial phase modulator 108 and a window 106. Herein, explanation is given on the case (normal illumination) where the transmissive spatial phase modulator 108 is not positively put to use, in which case such parallel excitation light is made incident through the portion illustrated in FIG. 4A with an subarea A and made from a transparent plate of the transmissive spatial phase modulator.

Figure 3:
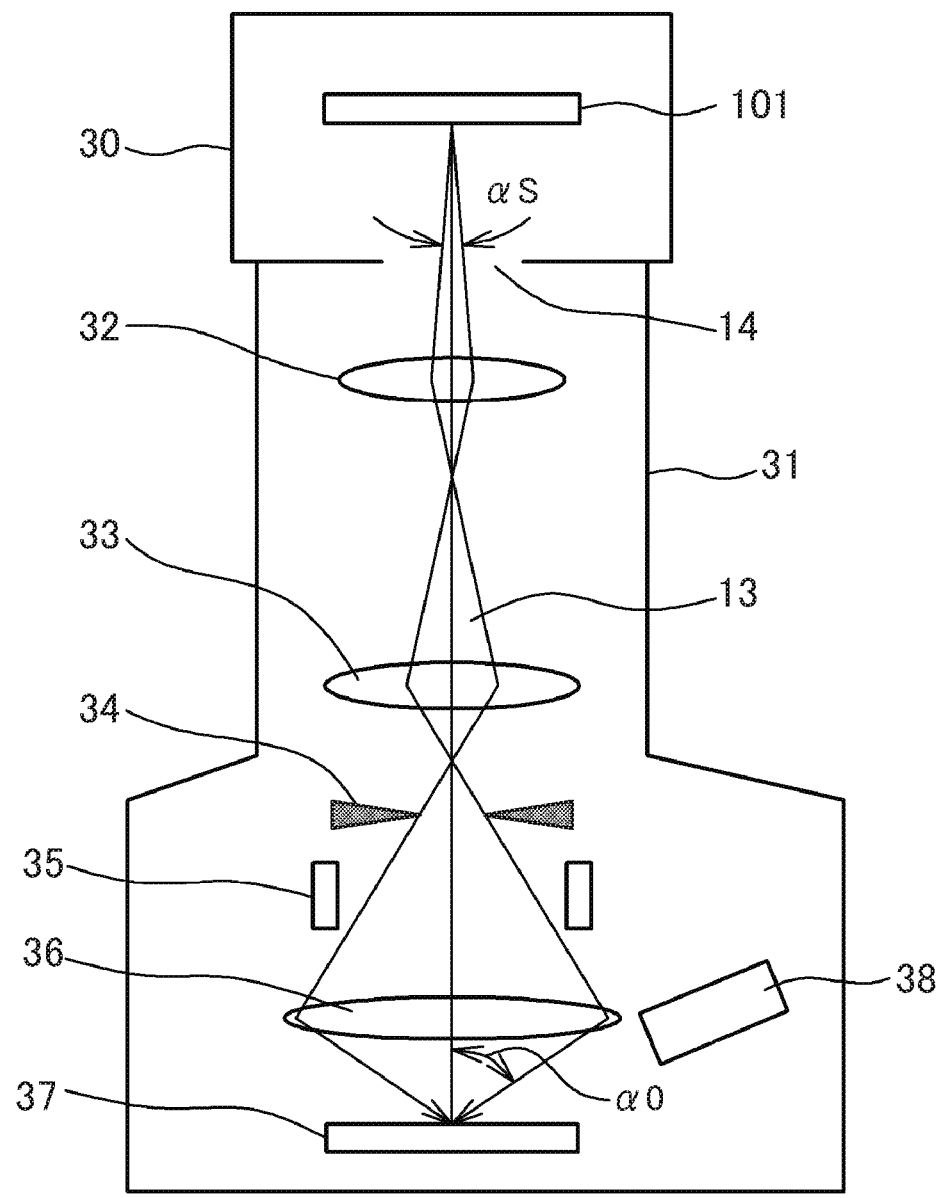
FIG. 3 is a schematic cross-sectional view illustrating one example of the electron microscope as a whole according to the first embodiment of the present invention.

An example of a scanning electron microscope (SEM) employing such electron gun is illustrated in FIG. 3. The electron beam 13 taken out of the opening on the lower part of an photoexcited electron gun 30 illustrated in FIG. 3 is reduced in size by a first condensing lens 32 and a second condensing lens 33 disposed within an electron optics system housing 31 so as to be focused on a sample 37 through an objective lens 36. The observation of the minute structure of the sample surface is feasible with a deflector 35 to displace the focal position and a secondary electron detector 38 to measure electrons generated from the sample 37. The energy distribution of the electron source adopted in the present embodiment ranges from 0.1 to 0.2 eV or is in better order than that of the counterpart cold cathode field emission (CFE) electron source made of W (tungsten) 0.3 eV, by which the resolution of the electron microscope can be enhanced especially by the alleviation of chromatic aberration at a lower acceleration voltage.

For instance, provided that the acceleration power source 105 is defined as −2 kV, the electron beam 13 emitted from the photoexcited electron gun 30 is expressed with 39 mA/sr or higher in terms of angular current density. At this time, the diameter of the electron source is 1 µm, while it requires that the diameter of the electron source focused on the sample be 0.5 nm or smaller in order to make observation with the resolution of 1 nm or smaller feasible. Thus, the total reduction ratio of the first and second condensing lenses and the objective lens 36 is set at 1/2000 or smaller.

Now, an aperture (angle limiting aperture) 34 and optical conditions are electronically and optically regulated such that the characteristic value of the divergence angle $\alpha_o$ of the objective lens onto the sample results in becoming 10 mrad. As the result of it, the electron beam which is able to pass through the aperture 34 results in being within such an extremely narrow range as 5 µrad or smaller in terms of the beam divergence angle $\alpha_s$ on the electron source side of the photoexcited electron gun 30. Consequently, the probe current with 3 pA or higher of the electrons irradiated onto the sample 37 is gained, so that satisfactory observation is feasible. The depth of focus under this condition is in the order of 100 nm in terms of spot diameter/$\alpha_o$. Up to the step and depth to such order, high resolution observation is feasible in one field of vision.

Figure 4A:
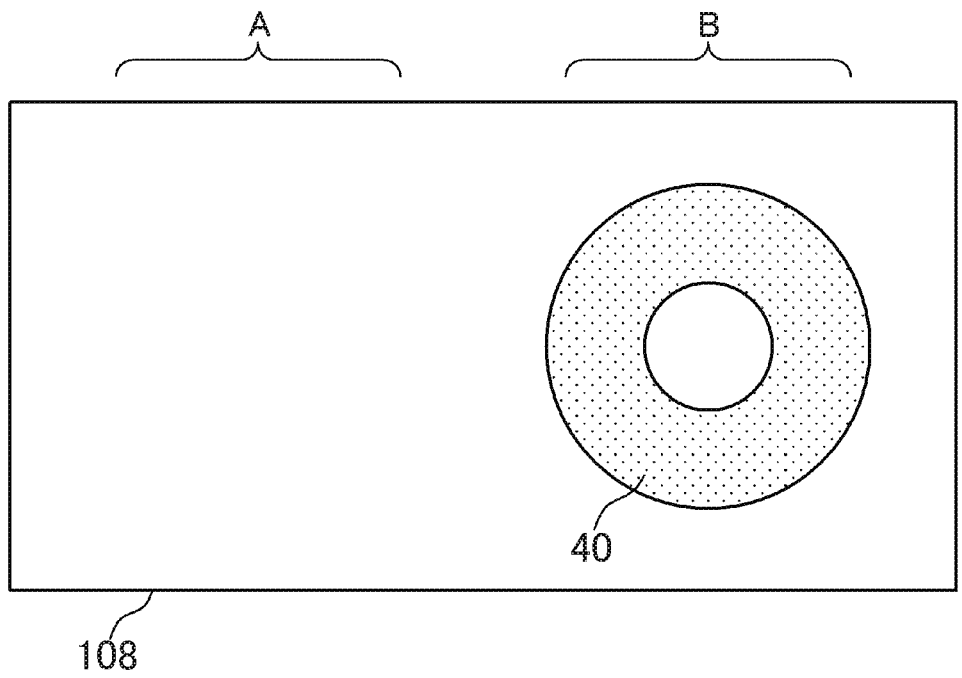
FIG. 4A is a plan view illustrating one example of the optical modulation means (transmissive spatial phase modulator) of the photoexcited electron gun illustrated in FIG. 1
Figure 5A:
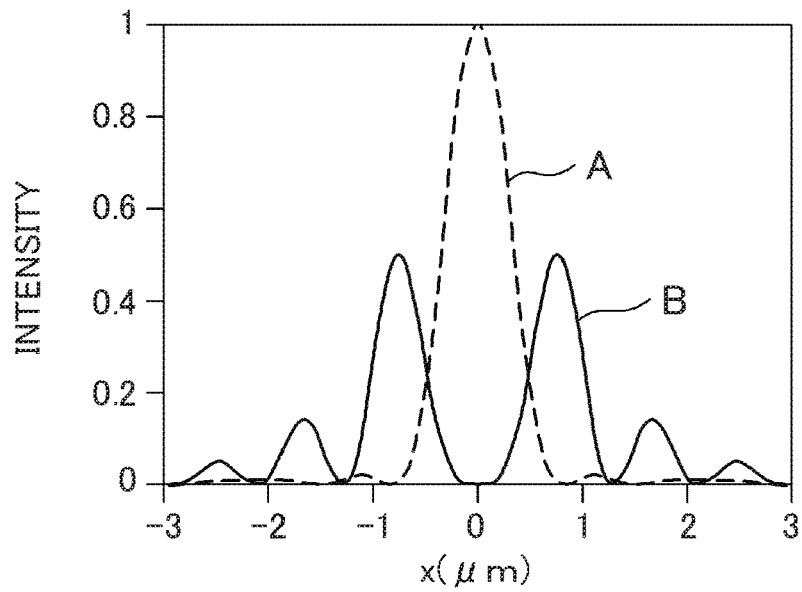
FIG. 5A is a graph to explain the intensity of the excitation light on the photocathode film when employing the transmissive spatial phase modulator illustrated in FIG. 4A.
Figure 5B:
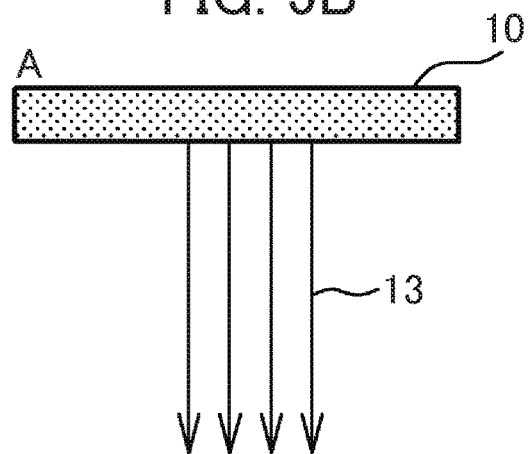
FIG. 5B is a schematic cross-sectional view illustrating the electron beam (normal) emitted from the photocathode film by the excitation light passed through the subarea A of the transmissive spatial phase modulator illustrated in FIG. 4A.
Figure 5C:
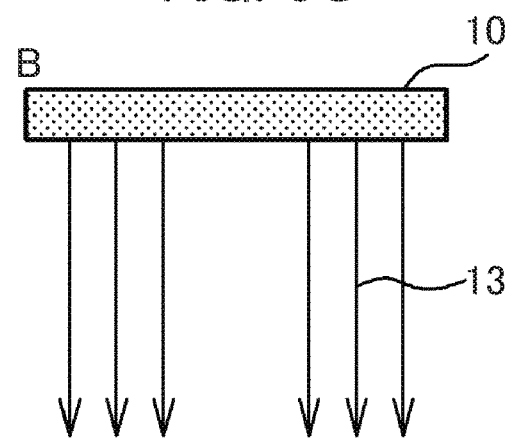
FIG. 5C is a schematic cross-sectional view illustrating the electron beam (annular) emitted from the photocathode film by the excitation light passed through the subarea B of the transmissive spatial phase modulator illustrated in FIG. 4A.

Then, upon the excitation light 12 travelling through the phase shift subarea B provided on the corresponding B area illustrated in FIG. 4A by making the transmissive spatial phase modulator 108 slide with a switch-over means (not illustrated in the drawings), the condensed excitation light takes an annular pattern on the photocathode film 10, the center portion of which is darkened as illustrated in FIG. 5A with a solid line B. The diameter of such annular pattern is in the order of 2 µm. As the result of which the electron beam 13 emitted from the photocathode film 10 takes an annular band, the center portion of which is removed as illustrated in FIG. 5C. In the case where such annular band is used in the reducing system in the order of 1/2000 at SEM illustrated in FIG. 3, due to the fact that the beam divergence angle αs on the electron source side of the photoexcited electron gun defined as 5 μrad is so extremely narrow that the electron beam is axially displaced by 100 nm or smaller while travelling by 20 mm in distance, the cross-sectional shape of the annular band emitted from the electron source whose diameter is 2μ is satisfactorily preserved. Now, the conditions of the phase shift area to obtain such annular band are as follows.

Figure 4B:
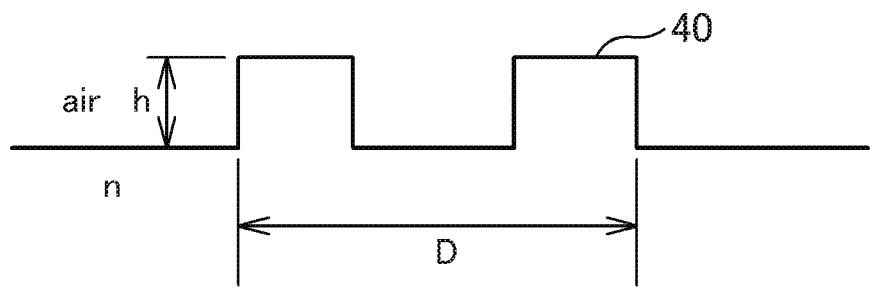
FIG. 4B is a cross-sectional view illustrating one example of the cross-sectional structure of the transmissive spatial phase modulator illustrated in FIG. 4A.

An example of the cross-sectional structure of the phase shift area is illustrated in FIG. 4B, in which the phase shift area 40 is such that it shifts the optical phase by π and the condition of the height h of such area is expressed with the following equation.

$$h=\lambda/(2(n-1))$$ (Equation 1)

Now, 'n' corresponds to the refractive index of the transparent phase mask, for which quartz is adopted with the characteristic value (n=1.46). In the case of the excitation light with 660 nm in wavelength, the value of 'h' is equal to 717 nm. The outer diameter 'D' of the phase shift area 40 is aligned to the diameter of the excitation light, and the condition of the inner diameter thereof 'd' is expressed with the following equation.

$$d=D/\sqrt{2}$$ (Equation 2)

Figure 2:
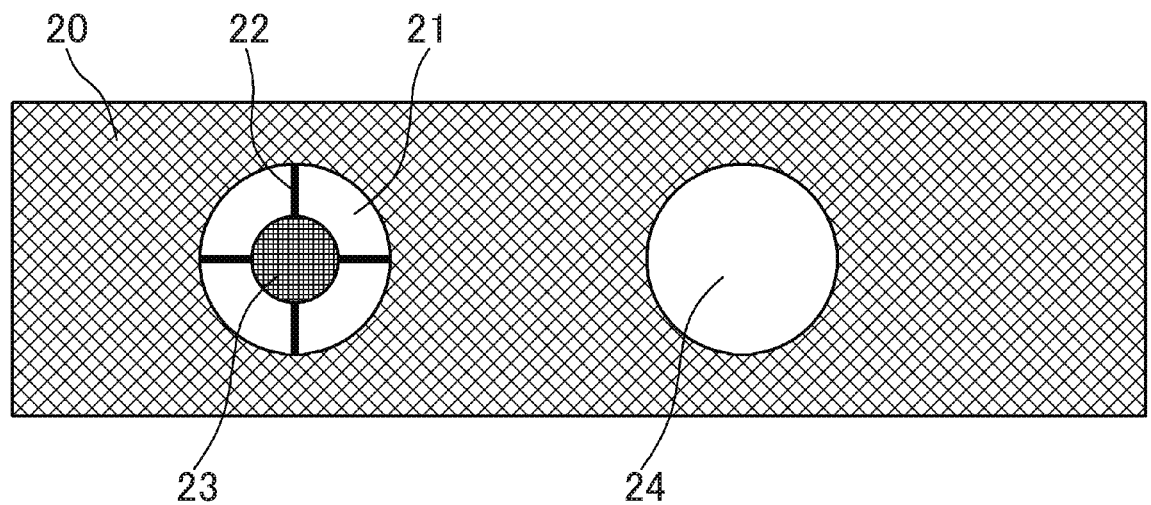
FIG. 2 is a plan view illustrating the mask for the annular illumination to explain the conventional annular illumination employing an electron beam.

Upon the electron beam with such annular band generated this way being focused on the sample 37 through the electron lenses, it extends the depth of focus by in the order of 50% with its interfering property. Thus, it is optimal for observing a sample with a height or depth in the order of 150 nm. Moreover, in comparison with the annular diaphragm according to the prior art illustrated in FIG. 2, there is no factor to deteriorate the brightness of the beam, so that the image capturing at a higher S/N ratio with the sufficient probe current (several pA or higher) is feasible. In the case of the normal illumination with the subarea A illustrated in FIG. 4A in use, the electron beam emitted from the photocathode film takes a spot-like cross-sectional shape as illustrated in FIG. 5B. According to the present embodiment, the switch-over between observation by the normal illumination and that by the annular illumination can be carried out by the phase mask (phase shift area) 40 which is inserted to the excitation light system and is one type belonging to the transmissive spatial phase modulator 108 being pulled in/out (selection between subareas A and B), such switch-over can be carried out, without modifying the electron optics system, in no time as well as the comparison between such observations is ready to make due to the fact that there is no change in field of vision to the advantage of the users.

Now, it is essential that the interfering property of the electrons emitted from the photocathode 101 adopted in the present embodiment is high. As the standard electron sources, the diameter of which electron source is in the order of 1 μm, the thermal electron sources employing a W (tungsten) filament are known, in which case interference between electrons does not occur differently from the photoexcited electron sources.

Figure 4C:
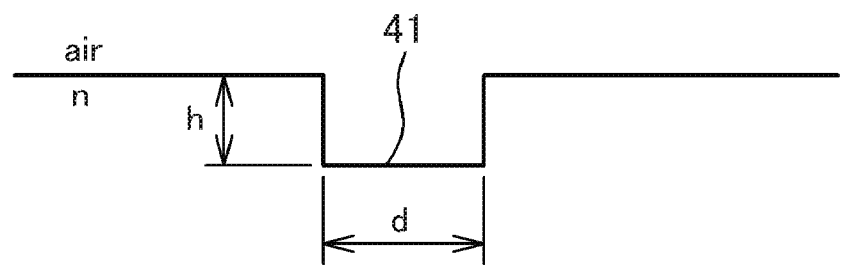
FIG. 4C is a cross-sectional view illustrating another example of the cross-sectional structure of the transmissive spatial phase modulator illustrated in FIG. 4A.

To note, the same effect is brought by preparing the phase shift area 41 corresponding to the inner diameter 'd' and making the excitation light with the outer diameter 'D' axially align as illustrated in FIG. 4C.

In the present embodiment, though the largely reducing electron optics system to be applied to a high resolution SEM is exemplified, it is also useful for focusing through an electron optics system with smaller reduction rate, a unimagnification electron optics system and an enlarging electron optics system. Since the electron beam can be irradiated onto a sample as hollow-cone illumination with the present photoexcited electron gun in use, by magnifying and focusing transmitted and scattered electrons, for example, chromatic aberration can be reduced and contrast of a biological sample can be enhanced.

According to the above embodiment, an electron microscope, by which the switch-over between annular illumination and normal illumination can be performed in an expeditious and readily manner and a better S/N ratio can be achieved, can be provided. Further, in the aspect of annular illumination, image acquisition with a larger depth of focus and a higher S/N ratio is feasible.

Second Embodiment

Figure 6:
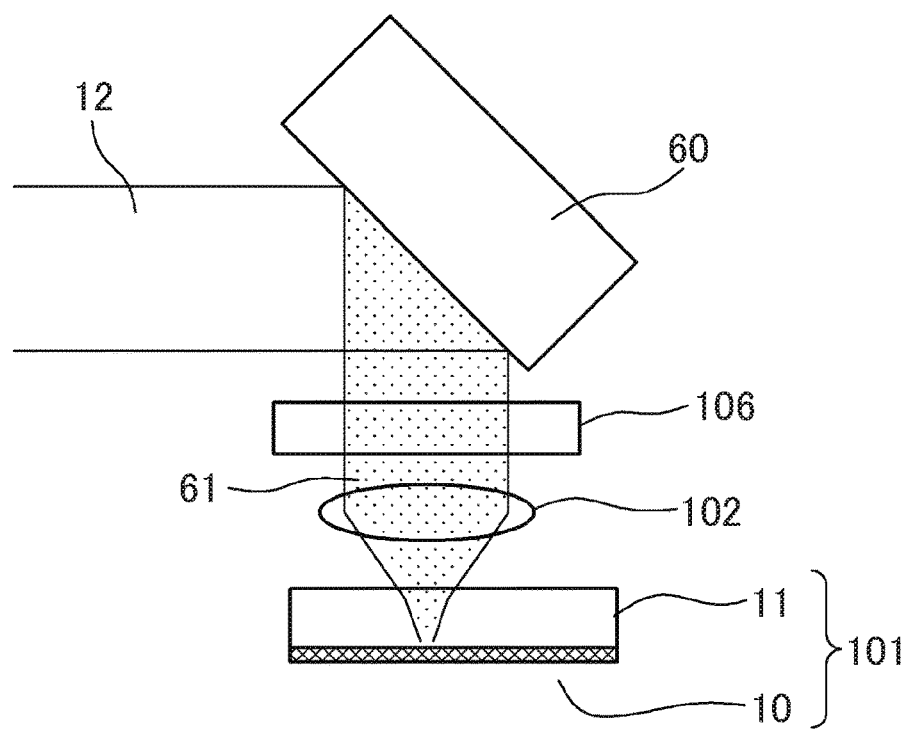
FIG. 6 is a schematic cross-sectional view illustrating one example of the photoexcited electron gun of the electron microscope according to the second embodiment of the present invention.

The second embodiment according to the present invention is explained with reference to FIGS. 6 to 8. It should be noted that the matters described in the first embodiment, but not described in the present embodiment can be applied to the present embodiment as well unless otherwise noted. According to the present embodiment, explanation is given on the switch-over among wide-area irradiation, forked interference pattern and normal illumination.

By adopting the spatial phase modulator (or also called as Spatial Light Modulator or SLM) for the optical modulation means, it permits various patterns of the excitation light to be formed on the cathode surface. In the present embodiment, explanation is given on an example in which a reflective liquid crystal SLM whose response speed is quicker is adopted for the optical modulation means. The SLM is such that the phase is subjected to modulation by controlling the orientations of two-dimensionally disposed liquid crystals with an electric field. FIG. 6 is a schematic cross-sectional view illustrating one example of the photoexcited electron source employing the reflective SLM. The entire structural arrangement of the electron gun within the vacuum container is the same as that of the first embodiment viewed in FIG. 1 and those of the vacuum container and the like are not illustrated in FIG. 6. The electron optics system according to the present embodiment has the same arrangement as illustrated in FIG. 3. In this case, the excitation light 12 is laterally made incident due to the fact that the reflective SLM 60 is in use herein. Reference sign 61 denotes the modulated excitation light.

Now, upon the setting of the reflective SLM 60 being tuned to a mode to preserve wavefront like a plane mirror (wavefront protection mode), because the focal point made by the condensing lens turns out to be a small spot whose diffraction limit is smaller like the broken line A illustrated in FIG. 5A and the electron beam 13 emitted from the photocathode film 10 results in becoming a spot-like one (normal irradiation), high-resolution observation is feasible (high-resolution observation mode).

Figure 7A:
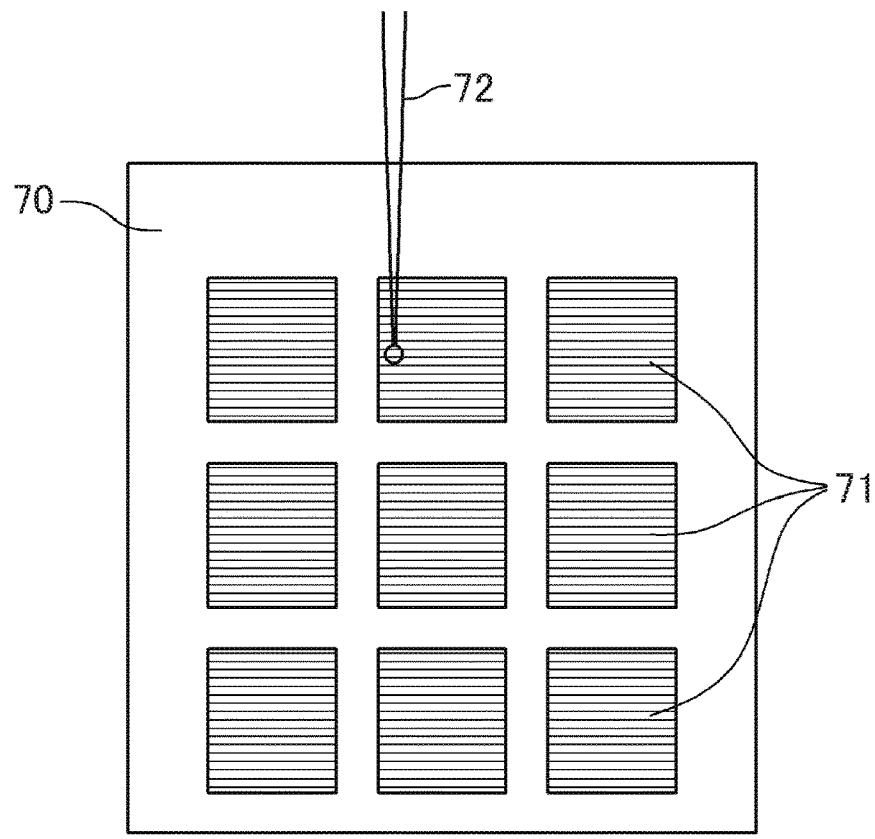
FIG. 7A is a schematic plan view of a sample (normal (spot) irradiation) to explain the optical modulation means (reflective spatial phase modulator) of the photoexcited electron gun illustrated in FIG. 6.
Figure 7B:
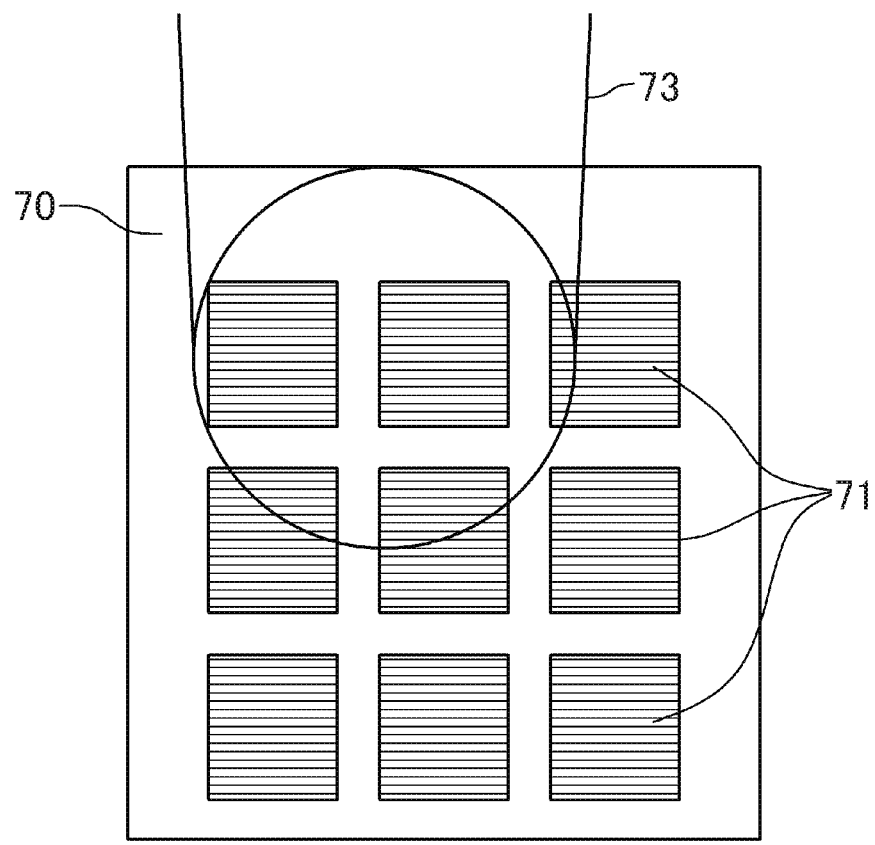
FIG. 7B is a schematic plan view of a sample (wide-area irradiation) to explain the optical modulation means (reflective spatial phase modulator) of the photoexcited electron gun illustrated in FIG. 6.

On the other hand, upon wavefront being disturbed (mode to disturb the wavefront), the focus of the excitation light becomes larger. The size of such focus can be selected according to how to disturb wavefront. FIGS. 7A and B illustrate a sample being observed. The subject to be observed is a minute circuit formed on a semiconductor substrate 70, in which when wavefront is preserved at the reflective SLM 60 (normal illumination), high-resolution SEM observation is performed on such circuit with an observation electron beam 72 as well squeezed to a minute spot as illustrated in FIG. 7A. In this regard, when there is provided an area (electrification area) 71 easy to be charged with electricity on the semiconductor substrate 70, upon the electron beam (observation electron beam) 72 being irradiated onto such area, electrification occurs so that anomaly on dimensional precision and contrast arise, with the result of which the S/N ratio deteriorates. In such a case, by disturbing the wavefront of the excitation light (mode to disturb the wavefront) with the reflective SLM 60, the size of the electron source is enlarged as illustrated in FIG. 7B such that an electrification control beam 73 is irradiated over a wide area like surrounding the electrification area 71 on the semiconductor substrate 70 (electrification control mode), thereby, the electric charge locally accumulated on the electrification area 71 being leveled out, which permits dimensional precision to be intact and anomaly on contrast to be corrected. In this regard, by switching over the reflective SLM 60 using a switch-over means (not illustrated in the drawing) with high speed between the wavefront protection mode and the mode to disturb the wavefront, it allows such circuit to be measured with a higher S/N ratio with the observation electron beam 72 switched over to the electrification control beam 73 during the scanning by the SEM. According to whether such electrification area is charged positively or negatively and the ease with which such area is charged with electricity, the irradiation duration, the interval, the amount of current and the irradiation range of such electrification control beam can be controlled by the intensity of the excitation light 12 and the setting of the reflective SLM 60. In this way, the shapes of the electron beam emitted from the photocathode film with the reflective SLM in use are varied, so that it does without modifying the setting of the electron optics system, and therefore, the pattern observation device and inspection device for semiconductors can be provided in a shorter delivery time and with a higher throughput.

Figure 8:
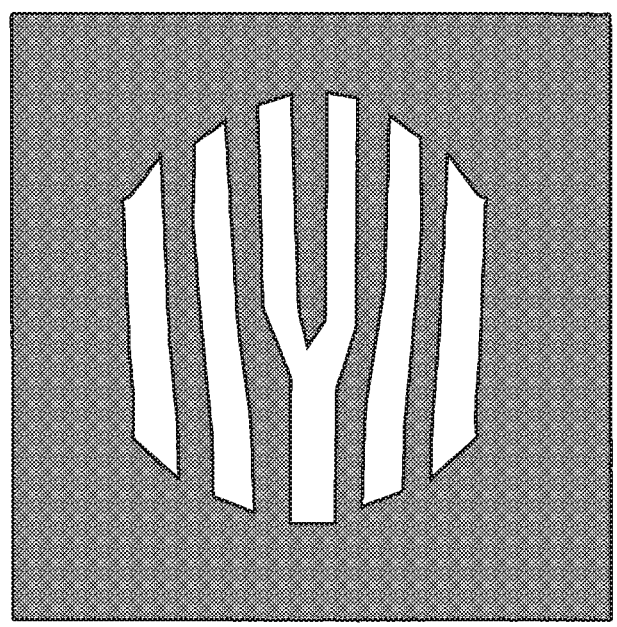
FIG. 8 is a schematic plan view of the excitation light (forked interference pattern) on the photocathode film to explain the optical modulation means (reflective spatial phase modulator) of the photoexcited electron gun illustrated in FIG. 6.

Moreover, diffraction gratings can be arranged with a holographic diffraction gratings generation means (not illustrated in the drawing) employing the reflective SLM, so that the forked interference fringe pattern as illustrated in FIG. 8 is available for the excitation light. By interference, vortex electron waves with orbital angular momentum are separated from the electron beam emitted from the electron source in this shape and made available to an angle away from the center axis of the electron beam. By selectively making use of such vortex electron waves according to the electron optics system in use, it provides an effective measuring means for samples with chirality. Further, the electron microscope according to the present invention turns out to be an experimental device essential for the future application of the vortex electron waves. This is, in other words, because the need to prepare a specific aperture as in the prior art is dispensed with and through the formation of the interference pattern of the excitation light by means of the reflective SLM 60 vortex electron waves as desired can be generated, and therefore various patterns can be readily generated.

Employing the reflective SLM, it enables the switch-over between electron beam pattern illumination as desired based on the excitation light pattern as desired which is focused on the photocathode film and normal illumination to be performed in an expeditious manner.

As described above, according to the present embodiments, they can provide an electron microscope, in which the switch-over among wide-area irradiation, an interference pattern as desired and normal illumination can be performed in an expeditious and readily manner and a better S/N ratio can be achieved. Further, by switching over between wide-area illumination and normal illumination, anomaly on contrast by electrification and the resulting deterioration of the S/N ratio can be suppressed. In addition, in the case of the electron beam being emitted with such forked interference fringe pattern in use, an effective measuring means for samples with chirality may be provided.

To note, the present invention is not limited to the above embodiments, but can be modified into various examples. For instance, with the embodiment in which a reflective liquid crystal SLM is adopted for the spatial phase modulator, it is needless to say or to explain with a concrete example that the same advantageous effects as such reflective liquid crystal SLM are brought also with a transmissive spatial phase modulator in use because such SLMs have the same function and effect in common. The above detailed embodiments are just intended for facilitating the persons skilled in the art to understand the present invention, so that the present invention is not necessarily limited to what covers all the features explained above. Further, a part of the features according to a certain embodiment may be replaced with those of the other embodiments, and the features according to the other embodiments may be added to those of a certain embodiment. In addition, as with apart of the features according to the respective embodiments, other features may be added thereto or replaced therewith through deletion.

LIST OF REFERENCE SIGNS

101: photocathode
102: condensing lens
103: extraction electrode
104: cathode holder
105: acceleration power source
106: window
107: parallel light source
108: transmissive spatial phase modulator (optical modulation means)
109: vacuum container
10: photocathode film
11: transparent substrate
12: excitation light
13: electron beam
14: opening
20: conventional annular illumination diaphragm
21: annular aperture portion
22: support
23: center shielding unit
24: conventional aperture
30: photoexcited electron gun
31: electron optics system housing
32: first condensing lens
33: second condensing lens
34: angle limiting aperture
35: deflector
36: objective lens
37: sample
38: secondary electron detector
40: phase shift area
41: phase shift area
60: reflective spatial phase modulator (optical modulation means)
61: modulated excitation light
70: semiconductor substrate
71: electrification area
72: observation electron beam (normal irradiation)
73: electrification control electron beam (wide-area irradiation)

The invention claimed is:

1. An electron microscope comprising:
a photocathode with negative electron affinity in use;
an excitation optical system to excite the photocathode;
an electron optics system to irradiate an electron beam generated from the photocathode by excitation light irradiated through the excitation optical system onto a sample, wherein the excitation optical system includes a light source device for the excitation light; and
an optical modulation means which is disposed in an optical path of the excitation light to perform spatial phase modulation to the excitation light,
wherein the optical modulation means includes a phase shift area, on a part of a substrate through which the excitation light can be transmitted, to make a focus of the transmitted excitation light taken on the photocathode in a form of annular band.

2. The electron microscope according to claim 1, wherein the excitation optical system is provided with condensing lenses to condense the excitation light on a minute area of the photocathode.

3. An electron microscope comprising:
a photocathode with negative electron affinity in use;
an excitation optical system to excite the photocathode;
an electron optics system to irradiate an electron beam generated from the photocathode by excitation light irradiated through the excitation optical system onto a sample, wherein the excitation optical system includes a light source device for the excitation light; and
an optical modulation means which is disposed in an optical path of the excitation light to perform spatial phase modulation to the excitation light,
wherein the optical modulation means has a wavefront protection mode in which electrons emitted from the photocathode by the excitation light are used in a high-resolution observation mode at the electron optics system, and a mode to disturb the wavefront in which the electrodes emitted from the photocathode by the excitation light are used in an electrification control mode at the electron optics system, and
wherein a switch-over means between the high-resolution observation mode and the electrification control mode is the means by which the wavefront protection mode is switched over to the mode to disturb the wavefront.

4. An electron microscope comprising:
a photocathode with negative electron affinity in use;
an excitation optical system to excite the photocathode; and
an electron optics system to irradiate an electron beam generated from the photocathode by excitation light irradiated through the excitation optical system onto a sample, wherein the excitation optical system includes a light source for the excitation light; and
an optical modulation means which is disposed in an optical path of the excitation light to perform spatial phase modulation to the excitation light,
wherein the optical modulation means includes a means to form a forked excitation light pattern and to form holographic diffracting gratings to separate vortex electron waves with orbital angular momentum for use from the electrons emitted from the photocathode by the excitation light with the forked pattern.

5. An electron microscope comprising:
a light source for an excitation light;
a photocathode to emit electrons by the excitation light from the light source for the excitation light;
an optical modulation means which is disposed in an optical path between the light source for the excitation light and the photocathode to make the excitation light optically modulated; and
an electron optics system to irradiate electrons emitted from the photocathode onto a sample as an electron beam,
wherein the optical modulation means has a first area not inviting optical modulation, a second area inviting the optical modulation, and a switch-over means to switch over between the first and second areas.

6. The electron microscope according to claim 5, wherein the optical modulation means includes a liquid crystal unit to control a presence of the optical modulation by an electric field applied.

7. The electron microscope according to claim 3, wherein the excitation optical system is provided with condensing lenses to condense the excitation light on a minute area of the photocathode.

8. The electron microscope according to claim 4, wherein the excitation optical system is provided with condensing lenses to condense the excitation light on a minute area of the photocathode.

* * * * *